United States Patent
Murase (10) Patent No.: US 12,134,805 B2
(45) Date of Patent: Nov. 5, 2024

(54) ALUMINUM ALLOY MEMBER FOR FORMING FLUORIDE FILM THEREON AND ALUMINUM ALLOY MEMBER HAVING FLUORIDE FILM

(71) Applicant: SHOWA DENKO K.K., Tokyo (JP)

(72) Inventor: Isao Murase, Oyama (JP)

(73) Assignee: SHOWA DENKO K.K., Tokyo (JP)

( * ) Notice: Subject to any disclaimer, the term of this patent is extended or adjusted under 35 U.S.C. 154(b) by 505 days.

(21) Appl. No.: 17/603,843

(22) PCT Filed: Mar. 11, 2020

(86) PCT No.: PCT/JP2020/010515
§ 371 (c)(1),
(2) Date: Oct. 14, 2021

(87) PCT Pub. No.: WO2020/213307
PCT Pub. Date: Oct. 22, 2020

(65) Prior Publication Data
US 2022/0235437 A1    Jul. 28, 2022

(30) Foreign Application Priority Data

Apr. 16, 2019 (JP) .................................. 2019-77922

(51) Int. Cl.
*C22C 21/06* (2006.01)
*C22F 1/04* (2006.01)
(Continued)

(52) U.S. Cl.
CPC ................ *C22C 21/06* (2013.01); *C22F 1/04* (2013.01); *C23C 14/06* (2013.01); *C23C 16/30* (2013.01)

(58) Field of Classification Search
CPC ... C22C 21/06; C22F 1/05; C22F 1/04; C23C 28/04; C23C 14/06; C23C 16/30
See application file for complete search history.

(56) References Cited

U.S. PATENT DOCUMENTS 6,334,916 B1    1/2002   Matsumoto et al.

FOREIGN PATENT DOCUMENTS

| JP | 8-92684 A  | 4/1996 |
| JP | 8-260088 A | 10/1996 |

(Continued)

OTHER PUBLICATIONS

English Abstract and English Machine Translation of Shigetoshi (JP 2003-119539) (Apr. 23, 2003).*

(Continued)

*Primary Examiner* — Jessee R Roe
(74) *Attorney, Agent, or Firm* — MILLEN, WHITE, ZELANO & BRANIGAN, P.C.; Ryan R. Pool (57) ABSTRACT

An aluminum alloy member forms a fluoride film thereon, which does not form a black dot-shaped bulged portion and, therefore, has excellent smoothness and excellent corrosion resistance against a corrosive gas, plasma, and others. An aluminum alloy member for forming a fluoride film thereon, consists of: Si: 0.01 mass % to 0.3 mass %; Mg: 0.5 mass % to 5.0 mass %; Fe: 0.05 mass % to 0.5 mass %; Cu: 0.5 mass % or less; Mn: 0.30 mass % or less; Cr: 0.30 mass % or less, and the balance being Al and inevitable impurities, wherein when an average major diameter of Fe-based crystallized products in the aluminum alloy member is "D" (μm), and an average crystalline particle diameter in the aluminum alloy member is "Y" (μm), a relational expression: $\log_{10} Y < -0.320D + 4.60 \ldots$ (1) is satisfied. A fluoride film is formed on at least a part of a surface of the aluminum alloy.

3 Claims, 3 Drawing Sheets

(51) Int. Cl.
*C23C 14/06* (2006.01)
*C23C 16/30* (2006.01)

(56) References Cited

FOREIGN PATENT DOCUMENTS

| | | |
|---|---:|---|
| JP | 11-61410 A | 3/1999 |
| JP | 2003-119539 A | 4/2003 |
| JP | 2003119540 A | 4/2003 |
| JP | 2006-349881 A | 12/2006 |
| JP | 3871544 B2 | 1/2007 |
| JP | 2009003111 A | 1/2009 |
| WO | 200015859 A1 | 3/2000 |
| WO | 2015/060331 A1 | 4/2015 |
| WO | 2020/008704 A1 | 1/2020 |

OTHER PUBLICATIONS

Notification of Reasons for Refusal dispatched on Oct. 31, 2023 on the corresponding Japanese patent application No. 2021-514827 (p. 1-4).
International Search Report dated Jun. 2, 2020 issued in corresponding PCT/JP2020/010515 application (3 pages).
Office Action in corresponding TW application 20200108903 dated Nov. 20, 2023 (pp. 1-5).

\* cited by examiner

ALUMINUM ALLOY MEMBER FOR FORMING FLUORIDE FILM THEREON AND ALUMINUM ALLOY MEMBER HAVING FLUORIDE FILM

TECHNICAL FIELD

The present invention relates to an aluminum alloy member for forming a fluoride film on at least a part of a surface of the aluminum alloy member to be used as, for example, a member (component) of a semiconductor production apparatus. It also relates to an aluminum alloy member having a fluoride film, the aluminum alloy member being intended to be used as, for example, a member (component) of a semiconductor producing apparatus.

Note that in this specification and claims, the term "fluoride film" means "a film containing at least fluorine" and does not mean "a film composed of fluoride only".

In this specification and claim, the term "average crystalline particle diameter" means an average crystalline particle diameter measured by a cutting method (Heyn method) defined in JIS G0551.

BACKGROUND ART

As a member material of a chamber, a susceptor, a backing plate, or the like, constituting a production apparatus of a semiconductor, an LCD, or the like, an expansile material or a casting material made of aluminum alloy is often used. In particular, an expansile material or a casting material made of Al—Mg-based JIS 5052 aluminum alloy or Al—Si—Mg-based JIS 6061 aluminum alloy are often used. Further, these production apparatus are used not only at high temperature but also in a corrosive gas atmosphere of silane ($SiH_4$), a fluorine-based gas, a chlorine-based halogen gas, or the like. Therefore, the production apparatus forms a hard anodic oxide coating on the surface of each member by subjecting each member to anodizing, thereby improving the corrosion resistance.

However, even if such a surface treatment has been performed, surface degradation occurs early depending on a usage environment and a frequency of use. Therefore, a surface treatment needs to be updated. In particular, in CVD and PVD treatment apparatuses, the operating temperature ranges from room temperature to about 400° C., and the thermal stress is repeatedly applied. Therefore, cracking may occur due to the difference in the thermal deformability between the base material and the anodic oxide coating. Further, during the long-term use, the anodic oxide coating may sometimes be abraded due to contact of a workpiece to the surface of the apparatus at the time of processing the workpiece, although no significant damage may occur.

Therefore, a vacuum chamber member excellent in gas resistance and plasma resistance in which a corrosion resistant protective film is formed on an Al base material surface has been proposed. The surface side of the corrosion resistant protective film is configured by a layer mainly composed of Al oxide or a layer mainly composed of Al oxide and Al fluoride. The substrate side of the corrosion resistant protective film is configured by a layer mainly composed of Mg fluoride or a layer mainly composed of Mg fluoride and Al oxide (see Patent Document 1).

Further, an aluminum alloy material excellent in corrosion resistance is also known in which a fluorine treatment film or the like is formed on a surface of an aluminum alloy base material. This aluminum alloy base material consists of Si:0.2 to 1.0 wt % and Mg: 0.3 to 2.0 wt %, the content of Fe, Cu, Mn, Cr, Zn, and Ni as impurities is each regulated to 0.1 wt % or less, and the balance is Al and inevitable impurities (see Patent Document 2).

These techniques aim to improve corrosion resistance by a fluorinated passivation film formed by subjecting an aluminum alloy base material to a fluorine treatment.

PRIOR ART DOCUMENT

Patent Document

Patent Document 1: Patent Document Japanese Unexamined Publication No. H11-061410
Patent Document 2: Japanese Unexamined Patent Application Publication No. 2003-119539

SUMMARY OF THE INVENTION

Problems to be Solved by the Invention

However, when an aluminum alloy base material is subjected to a fluorine treatment, a black dot-shaped bulged portion may sometimes occur on a surface of a formed corrosion resistant film. When such a black dot-shaped bulged portion has occurred, the heat ray absorption rate thereof increases. For this reason, a local temperature rise occurs during use in, for example, a CVD apparatus, a PVD apparatus, or the like. When such a local temperature rise has occurred, cracking occurs in the corrosion resistant film, resulting in a separation of the coating, which causes impurities particles.

Preferred embodiments of the present invention have been made in view of the above-described and/or other problems in the related art. Preferred embodiments of the present invention can significantly improve upon existing methods and/or devices.

The present invention has been made in view of such technical background. The present invention aims to provide an aluminum alloy member for forming a fluoride film thereon excellent in smoothness and excellent in corrosion resistance against corrosive gas and plasma without causing a black dot-shaped bulged portion. It also aims to provide an aluminum alloy member having such a fluoride film thereon.

Other objects and advantages of the present invention will be apparent from the following preferred embodiments.

Means for Solving the Problems

Figure 5:
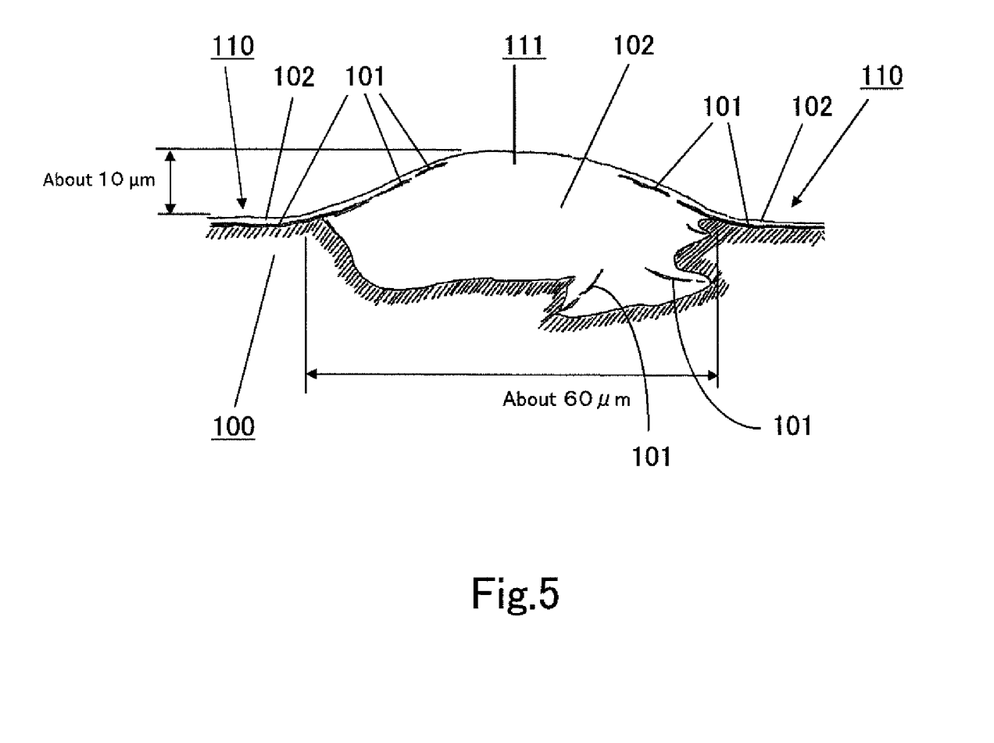
FIG. 5 is an explanatory view (schematic cross-sectional view) of a black dot portion generation.

The present inventor performed SEM-EDX mappings of the black dot-shaped bulged portion and its surrounding in order to investigate the causes of the occurrence of the black dot-shaped bulged portion and found the following. That is, as shown in FIG. 5, in a normal portion 110, a magnesium fluoride layer 101 and an aluminum fluoride layer 102 are laminated in this order on the surface of the aluminum alloy base material 100 to form a corrosion resistant film. However, it has been found that a portion (defective portion; separated portion) in which no magnesium fluoride layer is locally formed on the surface of the aluminum alloy base material 100 is present and the aluminum fluoride layer 102 greatly grows at the defective portion, and the bulged portion 111 of the aluminum fluoride is generated to mature the aluminum fluoride bulged portion 111. In order to suppress the generation of the black dot-shaped bulged portion that grows by the above-described mechanism, further studies have been performed and found the fact that the relation between the average major diameter of the Fe-based crystallized product in the aluminum alloy member and the average crystalline particle diameter in the aluminum alloy member is related to the generation of the black dot-shaped bulged portion, and the present invention has been completed. That is, in order to achieve the above-described object, the present invention provides the following means.

[1] An aluminum alloy member for forming a fluoride film thereon, consists of:
Si: 0.01 mass % to 0.3 mass %;
Mg: 0.5 mass % to 5.0 mass %;
Fe: 0.05 mass % to 0.5 mass %;
Cu: 0.5 mass % or less;
Mn: 0.30 mass % or less;
Cr: 0.30 mass % or less, and
the balance being Al and inevitable impurities,
wherein when an average major diameter of Fe-based crystallized products in the aluminum alloy member is "D" (μm), and an average crystalline particle diameter in the aluminum alloy member is "Y" (μm), a relational expression:

$$\text{Log}_{10} Y < -0.320D + 4.60 \quad (1)$$

is satisfied.

[2] The aluminum alloy member for forming a fluoride film thereon as recited in the above-described Item [1], wherein the aluminum alloy member is intended to be used as a member for a semiconductor producing apparatus.

[3] An aluminum alloy member having a fluoride film thereon,
wherein the fluoride film is formed on at least a part of a surface of the aluminum alloy member as recited in the above-described Item [1] or [2].

[4] The aluminum alloy member having a fluoride film, as recited in the above-described Item [3],
wherein the fluoride film has a thickness of 0.1 μm to 10 μm.

[5] The aluminum alloy member having a fluoride film, as recited in the above-described Item [3] or [4],
wherein the fluoride film is composed of a first film layer formed on the surface of the aluminum alloy member for forming a fluoride film thereon and a second film layer formed on a surface of the first film layer,
wherein the first film layer is a film containing a magnesium fluoride, and
wherein the second film layer is a film containing an oxide of aluminum fluoride and aluminum.

Effects of the Invention

[1] In the present invention as recited in the above-described Item [1], the present invention has a configuration in which it is composed of the above-described specified metal composition and satisfies the relational expression of the above-described Expression (1). Therefore, when a fluoride film is formed by subjecting a part of the surface of the aluminum alloy material for forming a fluorine film thereon to a fluorine treatment, a black dot-shaped bulged portion (hereinafter, sometimes may be simply referred to as "black dot portion") is not recognized. Further, the obtained aluminum alloy member with a fluoride film has excellent corrosion resistance against corrosive gas and plasma.

According to the invention recited in the above-described Item [2], it is composed of the above-described specified metal compositions and satisfies the relational expression of the above-described Expression (1). Therefore, it is possible to provide an aluminum alloy member for forming a fluoride film thereon which has the effects described in the above-described Item [1] and can be used as a member for a semiconductor producing apparatus.

In the present invention as recited in the above-described Item [3], it is composed of the above-described specific metal compositions and the configuration satisfies the relational expression of the above-described Expression (1). Therefore, it is possible to provide an aluminum alloy member having a fluoride film excellent in smoothness and excellent in corrosion resistance against corrosive gas, a plasma, and the like, which does not cause a black dot portion.

In the invention as described in the above-described Item [4], the thickness of the fluoride film is 0.1 μm or more. Therefore, it is possible to further improve the corrosion resistance against corrosive gas, plasma, and the like. Further, since the thickness is 10 μm or less, the productivity can be improved.

In the invention as recited in the above-described Item [5], the fluoride film is formed of a two-layer structure having the above-described particular configuration. Therefore, it is possible to further improve corrosion resistance to corrosive gas, plasma, and the like.

BRIEF DESCRIPTION OF THE DRAWINGS

In FIG. 4, the members plotted with the "○" indicates those in which no black dot portion was observed, and the members plotted with the "Δ" indicates those in which a black dot portion occurred. In the graph of FIG. 4, the lower left region of the diagonal line of the solid line extending from the upper left to the lower right is a region represented by Expression (1). In the members plotted in the region represented by Expression (1), no black dot portion was observed at all. On the other hand, it is understood that a black dot portion occurs in the members plotted in the upper right region of the oblique straight line.

EMBODIMENTS FOR CARRYING OUT THE INVENTION

Figure 1:
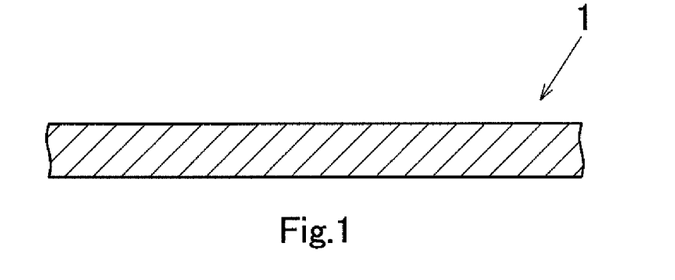
FIG. 1 is a cross-sectional view showing an embodiment of an aluminum alloy member for forming a fluoride film thereon according to the present invention.

An aluminum alloy member 1 for forming a fluoride film thereon according to the present invention, consists of:
Si: 0.01 mass % to 0.3 mass %;
Mg: 0.5 mass % to 5.0 mass %;
Fe: 0.05 mass % to 0.5 mass %;
Cu: 0.5 mass % or less;
Mn: 0.30 mass % or less;
Cr: 0.30 mass % or less, and
the balance being Al and inevitable impurities, wherein when an average major diameter of Fe-based crystallized products in the aluminum alloy member is "D" (μm), and an average crystalline particle diameter in the aluminum alloy member is "Y" (μm), a relational expression:

$$\text{Log}_{10} Y < -0.320D + 4.60 \tag{1}$$

is satisfied.

The aluminum alloy member 1 for forming a fluoride film thereon according to the present invention is used as a member for a semiconductor producing apparatus.

The composition (the significance of the limitation of each content rate range of each component) of the aluminum alloy according to the present invention will be described below.

The Si (component) reacts with fluorine to form a $SiF_4$ and sublimate, which deteriorates the efficiency of a fluoride film formation. The Si content rate in the above-described aluminum alloy member shall be in the range of 0.01 mass % to 0.3 mass %. When the Si content rate is less than 0.01 mass %, high purity base metal must be used, resulting in an increased cost. On the other hand, when the Si content rate exceeds 0.3 mass %, the Si reacts with fluorine to form $SiF_4$ and sublimates, thereby lowering the forming efficiency of a uniform fluoride film on the surface of the aluminum alloy member. In order to prevent the deterioration of the forming efficiency of the fluoride film as described above, the Si content rate is defined as 0.3 mass % or less. It is particularly preferable that the Si content rate in the aluminum alloy member range from 0.05 mass % to 0.20 mass %.

The Mg (component) is dissolved in the Al matrix to improve the strength of the aluminum alloy member, and the Mg reacts with F to form a dense magnesium fluoride ($MgF_2$) layer on the surface of the aluminum alloy member. The Mg content rate in the aluminum alloy member shall be in the range of 0.5 mass % to 5.0 mass %. When the Mg content rate is less than 0.5 mass %, the dense magnesium fluoride ($MgF_2$) layer cannot be formed. On the other hand, when the Mg content rate exceeds 5.0 mass %, the workability of the alloy material deteriorates. It is particularly preferable that the Mg content rate in the aluminum alloy member range from 1.5 mass % to 3.0 mass %.

The Cu (component) exerts the effect of uniformly dispersing the generated $Mg_2Si$ in the Al matrix. Since $Mg_2Si$ can be uniformly dispersed, it is possible to form a uniform magnesium fluoride ($MgF_2$) layer on the surface of the aluminum alloy member. The Cu content rate in the aluminum alloy member is set to 0% or more and 0.5 mass % or less. When the Cu content rate exceeds 0.5 mass %, a Cu-based crystallized product is generated, which inhibits the formation of the fluoride layer (fluoride film). It is particularly preferable that the Cu content rate in the aluminum alloy member range from 0.01 mass % to 0.2 mass %.

The Fe (component) generates a Fe-based crystallized product in the Al matrix. When a coarse crystallized product is present on the surface of the aluminum alloy member, the crystallized product inhibits the diffusion of Mg to the surface. Therefore, a dense layer of magnesium fluoride is not generated at the portion where the crystallized product is present. Consequently, the aluminum fluoride greatly grows to a bulged portion (i.e., black dot portion) of the aluminum fluoride at the position where no magnesium fluoride layer is formed. In order to prevent the formation of such a black dot portion, the Fe content rate needs to be 0.5 mass % or less. Further, when the Fe content rate exceeds 0.5 mass %, the size of the Fe-based crystallized product generated during the casting process becomes too large, which prevents the miniaturization at the plastic working, such as, e.g., rolling and forging of the post-process. On the other hand, when the Fe content rate is less than 0.05 mass %, casting cracking or the like occurs. Therefore, the Fe content rate in the aluminum alloy member is in the range of 0.05 mass % to 0.5 mass %. It is particularly preferable that the Fe content rate in the aluminum alloy member range from 0.08 mass % to 0.20 mass %.

The content rate of each of Mn (component) and Cr (component) is set to 0% or more and 0.30 mass % or less. When it exceeds 0.30 mass %, a coarse crystallized product is produced. An alloy composition not containing both Mn and Cr (i.e., 0% content rate) may be used. Alternatively, an alloy composition containing 0.30 mass % or less of Mn and not containing Cr may be used. Alternatively, an alloy composition containing 0.30 mass % or less of Cr and not containing Mn may be used. In particular, both the content rate of Mn (component) and that of Cr (component) are preferably set to 0% or more and 0.20 mass % or less.

The aluminum alloy member 1 for forming a fluoride film thereon according to the present invention is configured such that when an average major diameter of a Fe-based crystallized product in the aluminum alloy member is D (μm), and an average crystalline particle diameter in the aluminum alloy member is Y (μm), an expression:

$$\text{Log}_{10} Y < -0.320D + 4.60 \tag{1}$$

is satisfied.

Figure 4:
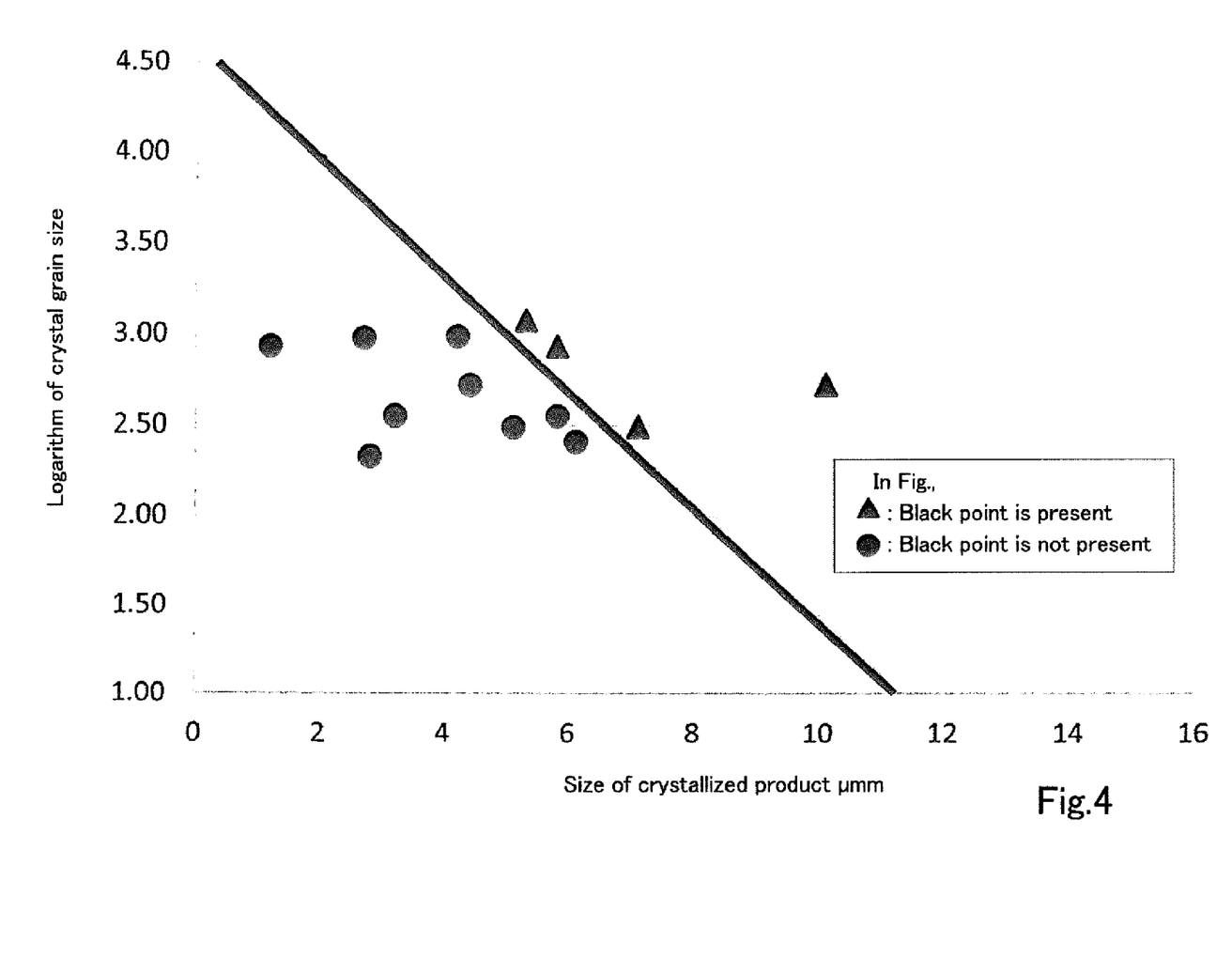
FIG. 4 is a graph plotted in which a common logarithm (K) of an average crystalline particle diameter (Y) is represented by a vertical axis and an average major diameter (D) of a Fe-based crystallized product is represented by a horizontal axis.

FIG. 4 is a graph in which the common logarithms (K) of the average crystalline particle diameter (Y) are plotted on the vertical axis and the average major diameter (D) of the Fe-based crystallized products are plotted on the horizontal axis, for the aluminum alloy member for forming a fluoride film thereon according to an example. In order to form a magnesium fluoride layer, the Mg inside the aluminum alloy needs to be diffused to the surface. The diffusion rate of the magnesium is larger in the grain boundary than in the crystal grain. The smaller the crystal grains, the larger the area of the grain boundary and the easier the diffusion of Mg to the surface, so that a magnesium fluoride layer can be formed even in a case where the size of the crystallized product becomes large.

Figure 2:
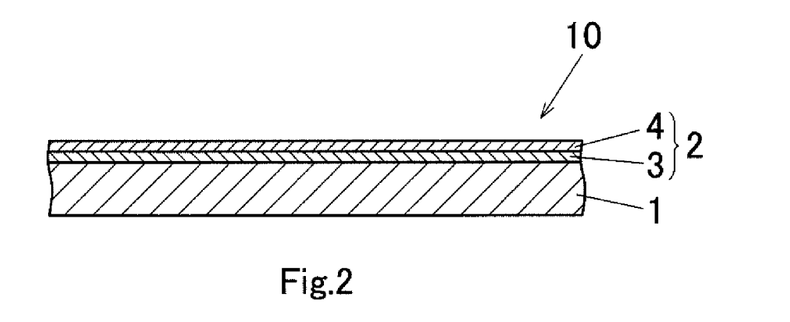
FIG. 2 is a cross-sectional view of an embodiment of an aluminum alloy member having a fluoride film according to the present invention.

That is, in the aluminum alloy member 1 for forming a fluoride film thereon according to the present invention in which the compositions of the aluminum alloy satisfy the condition of the content rate and satisfy the above-described Expression (1), no black dot portion (black dot-shaped bulged portion) is generated in the fluoride film when a fluoride film is formed by the fluorine treatment. It is, therefore, excellent in smoothness (no local temperature rise as described above occurs). Further, the aluminum alloy member 10 having the fluoride film 2 obtained as described above has excellent corrosion resistance against corrosive gas and plasma due to the presence of the fluoride film.

In contrast, in the region on the upper right side of the diagonal line of the solid line extending from the upper left to the lower right in FIG. 4 (the region not satisfying the Expression (1)), the size of the Fe-based crystallized product becomes too large, the Fe-based crystallized product inhibits the diffusion of Mg. As a consequence, as shown in FIG. 5, the magnesium fluoride layer 101 is not partially generated, and the aluminum fluoride layer 102 grows largely in the non-generated defective portion to generate a black dot portion (black dot-shaped bulged portion).

Even in a case where the compositions of the aluminum alloy satisfy the conditions of the content rate ranges of the components described above, a black dot portion (black dot-shaped bulged portion) is generated on the fluoride film when a fluoride film is formed by subjecting the aluminum alloy member having a configuration not satisfying the relational expression of Expression (1) to a fluorine treatment. When such a black dot portion occurs, in a case where it is used as, for example, a member of a semiconductor producing apparatus (such as a CVD-device, a PVD-device, a dry etching apparatus, or a vacuum deposition apparatus), the heat ray absorption rate of the portion increases, causing a local temperature rise. As a result, cracks occur in the fluoride film, resulting in the separation of the film, which causes impurity particles.

Figure 3:
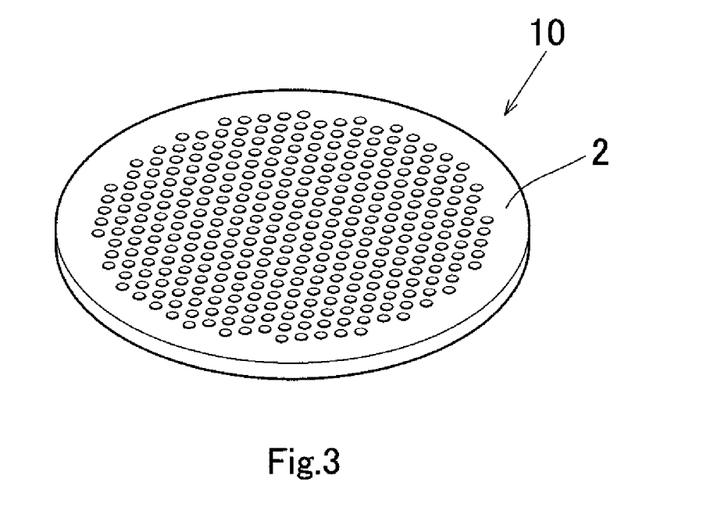
FIG. 3 is a perspective view of a shower head, which is an example of an aluminum alloy member having a fluoride film according to the present invention.

The aluminum alloy member 10 having a fluoride film according to the present invention is used as a member (component) or the like of a semiconductor producing apparatus (a CVD apparatus, a PVD apparatus, a dry etching apparatus, a vacuum deposition apparatus, or the like). Examples of the component include, but are not limited thereto, a shower head (see FIG. 3), a vacuum chamber, a susceptor, and a backing plate. The shower head 10 is formed as an aluminum alloy member 10 having a fluoride film 2 formed in a disk shape and has a large number of pores penetrating in its thickness direction.

In the case of a component of a semiconductor producing apparatus made of the aluminum alloy member 10 according to the present invention, although it is exposed to a fluorine gas atmosphere during the cleaning of the vacuum chamber of the semiconductor producing apparatus, there is an advantage that a uniform fluoride film is regenerated without causing black spots.

Next, an example of the aluminum alloy member 1 for forming a fluoride film thereon and a production method of an aluminum alloy member having a fluoride film will be collectively described.

(Casting Process)

An aluminum alloy molten metal A dissolved and prepared to have a composition consisting of: Si: 0.01 mass % to 0.3 mass %; Mg: 0.5 mass % to 5.0 mass %; Fe: 0.05 mass % to 0.5 mass %; Cu: 0.5 mass % or less; Mn: 0.30 mass % or less; Cr: 0.30 mass % or less; and the balance being Al and inevitable impurities is prepared. Thereafter, a casting (a casting plate material, a billet, etc.) is obtained by casting the aluminum alloy molten metal. The casting method is not particularly limited but may be a conventionally known method exemplified by a continuous casting and rolling method, a hot-top casting method, a float casting method, a semi-continuous casting method (DC casting method), and the like.

(Homogenization Heat Treatment Process)

The obtained casting is subjected to a homogenization heat treatment. That is, it is preferred to carry out a homogenization heat treatment in which the casting is held at a temperature between 450° C. and 580° C. for 5 hours to 10 hours. When it is below 450° C., the softening of the casting becomes insufficient, and the pressure at the time of the hot working is increased, resulting in a deteriorated appearance quality and deteriorated productivity. Therefore, it is not preferable. On the other hand, when the temperature exceeds 580° C., local dissolution occurs inside the casting, which is not preferable.

(Hot Working Process)

The casting is subjected to hot working. Although the hot working is not particularly limited but may be exemplified by a rolling process, an extrusion process, a forging process, or the like. The heating temperature at the time of the rolling process is preferably set to 450° C. to 550° C. Further, the heating temperature at the time of the extruding process is preferable to set to 450° C. to 550° C. Further, the heating temperature at the time of the forging process is preferably set to 450° C. to 550° C.

(Annealing Treatment Process)

Next, the workpiece (a rolled article, an extruded article, or the like) obtained by the above-described hot working is subjected to an annealing treatment by heating. The annealing treatment is preferably carried out at the temperature of 350° C. to 450° C. for 2 hours to 6 hours.

An aluminum alloy member 1 for forming a fluoride film thereon is obtained through the casting process, the homogenization heat treatment process, the hot working process, and the annealing treatment process, as described above.

(Anodizing Process)

By subjecting the aluminum alloy member 1 for forming a fluoride film thereon after the annealing treatment to anodizing to form an anodic oxide coating on the surface of the aluminum alloy member. The electrolyte for the anodizing is not particularly limited, and the examples thereof include a sulfuric acid aqueous solution and the like. It is preferred to control the temperature of an electrolyzer (electrolyte) between 10° C. and 40° C. for the anodizing. The voltage at the time of the anodizing is not particularly limited, but it is preferably set to a range of 10 V to 100 V. The anodizing time is preferably set in a range of 1 minute to 60 minutes.

(Fluorine Treatment Process)

Next, a fluorine treatment is performed on the aluminum alloy member after forming the anodic oxide coating. For example, the aluminum alloy member after forming the anodic oxide coating is set in a chamber to vacuum the inside of the chamber. Thereafter, a gas containing a fluorine gas is introduced into the chamber, and heating is performed in the fluorine gas atmosphere to form the fluoride film 2 on the surface of the aluminum alloy member. The heating temperature in the fluorine gas atmosphere is preferably set at 250° C. to 350° C. Thus, an aluminum alloy member 10 having the above-described fluoride film is obtained. For example, in a case where the application is a vacuum chamber component, an aluminum alloy member after the anodic oxide coating is used as a vacuum chamber component, and a fluorine gas is used to clean the inside of the vacuum chamber. A method in which a fluoride film is regenerated and thickly formed on the surface of the aluminum alloy member every time the above-described fluorine gas is used for cleaning may be adopted. Alternatively, for example, the fluoride film 2 may be formed by heating the aluminum alloy member after forming the anodic oxide coating formed in a shower head shape in a fluorine gas atmosphere with the aluminum alloy member set in a production facility for a semiconductor. Alternatively, plasma may be used to form the fluoride film 2. After forming the fluoride film as described above, the process may proceed directly to the production of the semiconductor.

It should be noted that the above-described production method is merely an example thereof and the aluminum alloy member 1 for forming a fluoride film thereon according to the present invention and the aluminum alloy member 10 having a fluoride film according to the present invention are not limited to those obtained by the above-described production method.

EXAMPLES

Next, some specific examples of the present invention will be described, but it should be noted that the present invention is not particularly limited to those of the examples.

Example 1

An aluminum alloy molten metal was obtained by heating an aluminum alloy consisting of Si: 0.15 mass %, Mg: 2.50 mass %, Cu: 0.07 mass %, Fe: 0.15 mass %, Mn: 0.03 mass %, Cr: 0.20 mass %, and the balance being Al and inevitable impurities. Then, using the aluminum alloy molten metal, a plate-like casting having a thickness of 200 mm was formed by a DC casting method.

Next, the plate-like casting was subjected to a homogenization heat treatment at 560° C. for 7 hours. Then, the plate-like casting was cut to a predetermined size and thickness, and then subjected to hot rolling at 500° C. to obtain an aluminum alloy plate having a thickness of 4 mm. Next, the aluminum alloy plate is cut to a size of 50 mm in length×50 mm in width, and then the aluminum alloy plate was heated at 400° C. for 4 hours to perform an annealing treatment. Thus, an aluminum alloy member 1 for forming a fluoride film thereon shown in FIG. 1 was obtained.

Next, the aluminum alloy plate (aluminum alloy member for forming a fluoride film thereon) after the annealing treatment was subjected to anodizing at 20 V for 2 minutes using a sulfuric acid aqueous solution of 15 mass % of concentration as an electrolyte and controlling the temperature of an electrolyzer (electrolyte) to 25° C. With this, an anodic oxide coating having a thickness of 2 μm was formed on the entire surface of the aluminum alloy plate.

Next, the aluminum alloy plate after the anodic oxide coating was formed was set in a chamber and the inside of the chamber was vacuumed, and then a fluorine contained inert gas was introduced into the chamber and held at 260° C. for 24 hours. With this, a fluoride film 2 having a thickness of 2 μm was formed. That is, an aluminum alloy member 10 having a fluoride film shown in FIG. 2 was obtained.

In the obtained aluminum alloy member 10 having the fluoride film, the fluoride film 2 was composed of: a first film layer 3 containing magnesium fluoride having a thickness of 0.5 μm formed on the surface of the aluminum alloy member 1 for forming a fluoride film thereon; and a second film layer (film layer containing aluminum fluoride and aluminum oxide) having a thickness of 1.5 μm formed on the surface of the first film layer 3.

Examples 2 to 9

An aluminum alloy member 1 for forming a fluoride film thereon shown in FIG. 1 was obtained in the same manner as in Example 1 except that as an aluminum alloy for forming an aluminum alloy molten metal, an aluminum alloy (an aluminum alloy containing Si, Mg, Cu, Fe, Mn, and Cr at content ratios shown in Table 1 and the balance being Al and inevitable impurities) was used. Then, in the same manner as in Example 1, an aluminum alloy member 10 having a fluoride film was obtained.

Comparative Examples 1 to 5

An Aluminum alloy member for forming a fluoride film thereon was obtained in the same manner as in Example 1 except that, as an aluminum alloy for forming an aluminum alloy molten metal, an aluminum alloy of the alloy composition shown in Table 1 (containing Si, Mg, Cu, Fe, Mn, Cr at the ratio shown in Table 1 respectively, and the balance being Al and inevitable impurities) was used. Then, an aluminum alloy member having a fluoride film was obtained in the same manner as Example 1.

For an aluminum alloy member for forming a fluoride film thereon of each of Examples and Comparative Examples obtained as described above, the "average crystalline particle diameter (Y)" and the "Fe-based crystallized product (D)" were measured by the measuring method described below.

<Measuring Method of Average Crystal Grain Size>

The surface of the aluminum alloy member for forming a fluoride film thereon was buffed and then subjected to an etching treatment by a Barker method. After water washing and drying, the etched surface was observed by an optical micrograph, and the "average crystalline particle diameter (Y)" was measured by a cutting method. Results are shown in Table 1.

<Measuring Method of Average Major Diameter of Fe-Based Crystallized Product>

After buffing the surface of the aluminum alloy member for forming a fluoride film thereon, an SEM (scanning electron microscope) observation was performed to extract a crystallized product appearing white with a backscattered electron image, and the absolute maximum length of these extracted crystallized product was measured with an image analysis apparatus. The average major diameter (D) of the Fe-based crystallized product is an average value of 100 pieces of data of 100 pieces of crystallized products selected from those with a large absolute maximum excluding those with a circle equivalent diameter of 0.3 μm or less from crystallized products arbitrary extracted from a rectangular field of view area of 315 μm×215 μm. The results are shown in Table 1.

TABLE 1

| | Composition of Aluminum alloy (mass %) | | | | | | Reduction rate (%) | Average crystalline particle diameter Y (μm) | $K = \log_{10}Y$ | Average major diameter of Fe-based crystallized product | Calculated value M on the right side of the inequality of Expression (1) | Large/small relation between K and M | Whether Expression (1) is satisfied | Evaluation of presence or absence of black point ○: present X: absent |
|---|---|---|---|---|---|---|---|---|---|---|---|---|---|---|
| | Si | Mg | Cu | Fe | Mn | Cr | | | | | | | | |
| Ex. 1 | 0.15 | 2.50 | 0.08 | 0.21 | 0.03 | 0.19 | 77 | 356 | 2.5514 | 3.2 | 3.576 | K < M | Satisfied | ○ |
| Ex. 2 | 0.16 | 0.55 | 0.07 | 0.20 | 0.03 | 0.19 | 77 | 528 | 2.7226 | 4.4 | 3.192 | K < M | Satisfied | ○ |
| Ex. 3 | 0.15 | 4.9 | 0.07 | 0.22 | 0.03 | 0.20 | 77 | 213 | 2.3284 | 2.8 | 3.704 | K < M | Satisfied | ○ |
| Ex. 4 | 0.17 | 2.49 | 0.45 | 0.20 | 0.04 | 0.21 | 77 | 356 | 2.5514 | 5.8 | 2.744 | K < M | Satisfied | ○ |

TABLE 1-continued

| | Composition of Aluminum alloy (mass %) | | | | | | Reduction rate (%) | Average crystalline particle diameter Y (μm) | K = log₁₀Y | Average major diameter of Fe-based crystallized product | Calculated value M on the right side of the inequality of Expression (1) | Large/small relation between K and M | Whether Expression (1) is satisfied | Evaluation of presence or absence of black point ○: present X: absent |
|---|---|---|---|---|---|---|---|---|---|---|---|---|---|---|
| | Si | Mg | Cu | Fe | Mn | Cr | | | | | | | | |
| Ex. 5 | 0.16 | 2.50 | 0.06 | 0.06 | 0.04 | 0.20 | 77 | 857 | 2.9330 | 1.2 | 4.216 | K < M | Satisfied | ○ |
| Ex. 6 | 0.16 | 2.50 | 0.07 | 0.49 | 0.04 | 0.20 | 99 | 309 | 2.4900 | 5.1 | 2.968 | K < M | Satisfied | ○ |
| Ex. 7 | 0.15 | 2.51 | 0.08 | 0.21 | 0.26 | 0.20 | 77 | 258 | 2.4116 | 6.1 | 2.648 | K < M | Satisfied | ○ |
| Ex. 8 | 0.17 | 2.49 | 0.07 | 0.20 | 0.02 | 0.02 | 77 | 956 | 2.9805 | 2.7 | 3.736 | K < M | Satisfied | ○ |
| Ex. 9 | 0.15 | 2.50 | 0.07 | 0.20 | 0.03 | 0.26 | 77 | 978 | 2.9903 | 4.2 | 3.256 | K < M | Satisfied | ○ |
| Comp. Ex. 1 | 0.17 | 2.48 | 0.06 | 0.48 | 0.04 | 0.18 | 77 | 532 | 2.7259 | 10.1 | 1.368 | K > M | Not Satisfied | X |
| Comp. Ex. 2 | 0.15 | 2.51 | 0.07 | 0.61 | 0.04 | 0.19 | 99 | 310 | 2.4914 | 7.1 | 2.328 | K > M | Not Satisfied | X |
| Comp. Ex. 3 | 0.15 | 2.50 | 0.07 | 0.22 | 0.40 | 0.20 | 77 | 861 | 2.9350 | 5.8 | 2.744 | K > M | Not Satisfied | X |
| Comp. Ex. 4 | 0.15 | 2.49 | 0.07 | 0.20 | 0.02 | 0.36 | 77 | 1200 | 3.0792 | 5.3 | 2.904 | K > M | Not Satisfied | X |
| Comp. Ex. 5 | 0.15 | 2.50 | 0.56 | 0.20 | 0.03 | 0.18 | 77 | 400 | 2.6021 | 6.1 | 2.648 | K < M | Satisfied | X |

$M = -0.320D + 4.60$

The aluminum alloy member having a fluoride film of each of Examples and Comparative Examples obtained as described above was examined for the presence or absence of a black dot portion (black dot-shaped bulged portion) in the fluoride film using a 25× microscope based on the following evaluating method and evaluated based on the criteria described below. The results are shown in Table 1.
(Criteria)
○: No black dot portion was present (not existence)
Δ: Black dot portions were present slightly
X: Black dot portions are present notably As is apparent from Table 1, the aluminum alloy material with a fluoride film according to the present invention obtained using the aluminum alloy member for forming a fluoride film thereon of Examples 1 to 9 of the present invention showed no black dot portion in the fluoride film.

On the other hand, black dot portions were notably seen in the fluoride film of Comparative Examples 1 to 5.

INDUSTRIAL APPLICABILITY

An aluminum alloy member 1 for forming a fluoride film thereon according to the present invention is used as a member (component) or the like of a semiconductor producing apparatus (a CVD apparatus, a PVD apparatus, a dry etching apparatus, a vacuum deposition apparatus, or the like) in which at least a part of the surface is subjected to a fluorine treatment to form a fluoride film. However, the aluminum alloy member 1 for forming a fluoride film thereon according to the present invention is not limited to this application.

The aluminum alloy member 10 having a fluoride film according to the present invention is used as a member (component) of a semiconductor producing apparatus (a CVD apparatus, a PVD apparatus, a dry etching apparatus, a vacuum deposition apparatus, or the like). However, the aluminum alloy member 10 for forming a fluoride film thereon according to the present invention is not limited to this application.

Examples of the component include, but are not limited thereto, a shower head (see FIG. 3), a vacuum chamber, a susceptor, and a backing plate.

The present invention can be used in various applications other than "for a semiconductor producing apparatus".

This application claims priority to Japanese Patent Application No. 2019-77922, filed Apr. 16, 2019, the contents of which is incorporated herein by reference in its entirety.

The terms and expressions used herein are for illustration purposes only and are not used for limited interpretation, do not exclude any equivalents of the features shown and stated herein, and it should be recognized that the present invention allows various modifications within the scope of the present invention as claimed.

DESCRIPTION OF SYMBOLS

1: Aluminum alloy member for forming a fluoride film thereon
2: Fluoride film
3: First film layer
4: Second film layer
10: Aluminum alloy member having a fluoride film

The invention claimed is:
1. An aluminum alloy member having a fluoride film thereon,
wherein the fluoride film is formed on at least a part of a surface of the aluminum alloy member wherein the aluminum alloy member consists of:
Si: 0.01 mass % to less than 0.3 mass %;
Mg: 0.5 mass % to 5.0 mass %;
Fe: 0.05 mass % to 0.5 mass %;
Cu: 0.5 mass % or less;
Mn: 0.30 mass % or less;
Cr: 0.30 mass % or less, and
the balance being Al and inevitable impurities,
wherein when an average major diameter of Fe-based crystallized products in the aluminum alloy member is "D" (μm), and an average crystalline particle diameter in the aluminum alloy member is "Y" (μm), a relational expression:

$$\text{Log}_{10} Y < -0.320D + 4.60 \tag{1}$$

is satisfied, and
- wherein the fluoride film is composed of a first film layer formed on the surface of the aluminum alloy member for forming a fluoride film thereon and a second film layer formed on a surface of the first film layer,
- wherein the first film layer is a film containing a magnesium fluoride, and
- wherein the second film layer is a film containing an oxide of aluminum fluoride and aluminum.

2. The aluminum alloy member having a fluoride film thereon of claim 1,
- wherein the aluminum alloy member is suitable for use as a member for a semiconductor producing apparatus.

3. The aluminum alloy member having a fluoride film of claim 1,
- wherein the fluoride film has a thickness of 0.1 μm to 10 μm.

* * * * *